(12) United States Patent
Ugurbil

(10) Patent No.: US 9,671,481 B2
(45) Date of Patent: Jun. 6, 2017

(54) METHOD FOR REDUCING POWER DEPOSITION IN MAGNETIC RESONANCE IMAGING USING MULTIBAND PULSES AND MULTICHANNEL TRANSMISSION

(75) Inventor: Kamil Ugurbil, Minneapolis, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 923 days.

(21) Appl. No.: 13/995,875

(22) PCT Filed: Dec. 20, 2011

(86) PCT No.: PCT/US2011/066081
§ 371 (c)(1),
(2), (4) Date: Sep. 6, 2013

(87) PCT Pub. No.: WO2012/088065
PCT Pub. Date: Jun. 28, 2012

(65) Prior Publication Data
US 2013/0342200 A1    Dec. 26, 2013

Related U.S. Application Data

(60) Provisional application No. 61/425,511, filed on Dec. 21, 2010.

(51) Int. Cl.
*G01R 33/54* (2006.01)
*G01R 33/483* (2006.01)
(Continued)

(52) U.S. Cl.
CPC ....... *G01R 33/543* (2013.01); *G01R 33/4835* (2013.01); *G01R 33/3415* (2013.01); *G01R 33/5612* (2013.01)

(58) Field of Classification Search
CPC .............. G01R 33/3415; G01R 33/543; G01R 33/4853
See application file for complete search history.

(56) References Cited

U.S. PATENT DOCUMENTS 6,253,101 B1    6/2001  Seng
2005/0134270 A1  6/2005  Dumoulin
(Continued)

FOREIGN PATENT DOCUMENTS

EP      1 677 123      7/2006
WO     2008/041155     4/2008

OTHER PUBLICATIONS

International Search Report as mailed on Mar. 30, 2012 for International Application No. PCT/US2011/066081.
(Continued)

*Primary Examiner* — Gregory H Curran
(74) *Attorney, Agent, or Firm* — Quarles & Brady LLP

(57) ABSTRACT

A method is provided for substantially simultaneously manipulating spins in a plurality of slice locations using a magnetic resonance imaging ("MRI") system that includes a radio frequency ("RF") coil array composed of a plurality of RF coil elements, and in which power deposition, which may be measured as specific absorption rate ("SAR"), is reduce A plurality of slice locations to be substantially simultaneously manipulated with the MRI system are selected, and an RF transmission map ($B_1^+$map) is provided for each of the plurality of RF coil elements. A subset of slice locations to be manipulated by each of the RF coil elements is then selected using the provided RF transmission maps. Using the selected subsets of slice locations, an RF pulse to be transmitted by each of the RF coil elements is designed. The designed RF pulses are then substantially simultaneously transmitted by the MRI system to substantially simultaneously manipulate spins in each o the plurality of slice locations.

16 Claims, 5 Drawing Sheets

(51) Int. Cl.
    *G01R 33/3415*     (2006.01)
    *G01R 33/561*     (2006.01)

(56) References Cited

U.S. PATENT DOCUMENTS

2007/0164742 A1     7/2007   Bito et al.
2009/0302839 A1*  12/2009  Benschop .......... G01R 33/3415
                                                324/307

OTHER PUBLICATIONS

Larkman, D. J., et al.; "Use of Multicoil Arrays for Separation of Signal from Multiple Slices Simultaneously Excited," Journal of Magnetic Resonance Imaging, Society of Magnetic Resonance Imaging, Oak Brook, IL; vol. 13, No. 2, Jan. 1, 2001; pp. 313-317, XP002636406; ISSN: 1053-1807.

* cited by examiner

METHOD FOR REDUCING POWER DEPOSITION IN MAGNETIC RESONANCE IMAGING USING MULTIBAND PULSES AND MULTICHANNEL TRANSMISSION

CROSS-REFERENCE TO RELATED APPLICATIONS

This application represents the U.S. National Stage of International Application No. PCT/US2011/066081, filed Dec. 20, 2011 which claims the benefit of, and incorporates by reference U.S. Provisional Patent Application Ser. No. 61/425,511 filed on Dec. 21, 2011 and entitled "Power Reduction with Multiband Pulses Using Multichannel Transmit."

STATEMENT REGARDING FEDERALLY SPONSORED RESEARCH

This invention was made with government support under RR008079 and MH091657 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for reducing power deposition, sometimes quantified as the specific absorption rate ("SAR") producing during a substantially simultaneous multi-slice acquisition.

Since its initial application, scan time for volume coverage with echo-planar imaging ("EPI") or spiral-type MRI data acquisitions has not substantially decreased. Nearly all the successful efforts to shorten EPI acquisition times have targeted reducing the number of refocused echoes needed for spatial encoding to form an image, such as by means of partial Fourier imaging, parallel imaging, or sparse data sampling techniques. Although these approaches decrease scan time for spatial encoding of a single slice in EPI, they do not necessarily reduce the time required for image acquisitions by a significant amount.

Recently, additional accelerations have been demonstrated by "slice multiplexing," whereby multiple image slice locations are excited and acquired simultaneously using a multiband ("MB") radio frequency ("RF") pulse, a technique commonly referred to as multiband imaging. The MB technique is limited in part by power deposition and SAR considerations, especially at high magnetic fields, and in part by the peak power and/or voltage that can be tolerated by the RF coil circuitry or the peak power and/or voltage that can be generated by the amplifier in an MRI system. These limitations arise because multiband RF pulses that are employed in MB imaging typically represent the sum of individual, single-band RF pulses that affect only spins in a single slice location. This sum of individual single-band RF pulses leads to an increase in the voltage of the multiband RF pulse that is linear with the number of different slice locations that are simultaneously manipulated, a quantity also referred to as the multiband factor. Because of this voltage increase, the power applied to the RF coil increases quadratically with the multiband factor when the pulse duration and, if repeated, the number an duration of such repetitions are kept the same as for a single-band RF pulse application. For the multiband technique, the multiple applications of multiband RF pulses to image an entire volume-of-interest increases the power applied to the RF coil, as well as the power deposited to the subject, quadratically with the multiband factor of the multiband RF pulses used. Again, this quadratic increase in power is relative to the power applied of deposited when the same general pulse form is employed to accomplish single versus multiple slice excitation and the time required to cover the volume-of-interest is reduced correspondingly by the multiband factor SAR, which is a measure of the rate at which energy is absorbed by the body when exposed to an RF electromagnetic field and is measured in watts per kilogram of tissue ("W/kg"), is a concern when conducting MRI experiments on human subjects. As noted above, SAR is especially a concern during the simultaneous excitation of multiple slice locations. This is because when multiple RF pulses are simultaneously employed, the local electric fields generated by each RF pulse undergo local superposition and local extremes in electric field magnitude may arise, leading to spikes in local and global SAR that are of concern to regulatory bodies in both the United States and Europe. For a discussion of these regulatory concerns in the United States, see, for example, Center for Devices and Radiologic Health "Guidance for the Submission of Premarket Notifications for Magnetic Resonance Diagnostic Devices," Rockville, Md.: *Food and Drug Administration;* 1998, and in Europe, see, for example, International Electrotechnical Commission, "International Standard, Medical Equipment-Part 2: Particular Requirements for the Safety of Magnetic Resonance Equipment for Medical Diagnosis, 2nd Revision," *Geneva: International Electrotechnical Commission;* 2002.

The need to stay below safe SAR limits often requires unfavorable tradeoffs in acquisition parameters such as increased repetition time ("TR") or reduced flip angle. SAR becomes especially problematic at field strengths of 3 T and higher, where the power needed for a given flip angle increases approximately quadratically with magnetic field magnitude; thus, an increase of as much as four-fold as compared to 1.5 T applications can be present.

In general, the use of multiband RF pulses increases the peak RF power requirements. Moreover, when the use of the multiband RF pulses is employed to shorten the TR for volume coverage relative to a single-band acquisition, while retaining the same volume coverage, the average SAR is also increased due to the faster repetition of the RF pulses. Correspondingly, if the same TR is used, but the volume coverage is extended, the average SAR is also increased. The potentially significant increase in the SAR therefore restricts the use of multiband imaging sequences to low SAR pulse sequences, such as gradient echo EPI, especially at high magnetic fields. Even in such low-power applications, however, SAR and/or the tolerance of the RF coils and the electrical components of the RF chain may run into limitations.

It would therefore be desirable to provide a method for the simultaneous manipulation of spins using RF pulses that manipulate multiple slice locations with a reduction in power deposition, which may be measured as SAR, produced by the application of the RF pulses and/or reduction in peak power an voltage applied to the RF coil. Examples of spin manipulation include excitation, inversion, and refocusing. Such a method would broaden the applicability of multiband RF pulses to imaging pulse sequences other than historically low SAR sequences, and would allow for improving other imaging parameters, such as TR and volume coverage, without risking unsafe levels of SAR.

SUMMARY OF THE INVENTION

The present invention overcomes the aforementioned drawbacks by providing a method for substantially simultaneously transmitting a plurality of RF pulses from different radio frequency ("RF") coil elements in an RF coil array.

It is an aspect of the invention to provide a method for substantially simultaneously manipulating spins in a plurality of slice locations using a magnetic resonance imaging ("MRI") system that includes an RF coil array composed of a plurality of RF coil elements. A plurality of slice locations to be substantially simultaneously manipulated with the MRI system are selected, and a $B_1^+$ (RF transmission) map is provided for each of the plurality of RF coil elements. A subset of slice locations to be manipulated by each of the RF coil elements is then selected using the provided $B_1^+$ maps. Using the selected subsets of slice locations, an RF pulse to be transmitted by each of the RF coil elements is designed. The designed RF pulses are then substantially simultaneously transmitted by the MRI system to substantially simultaneously manipulate spins in each of the plurality of slice locations.

It is also an aspect of the invention to provide an MRI system that includes a magnet system configured to generate a polarizing magnetic field about at least a portion of a subject arranged in the MRI system, a plurality of gradient coils configured to apply a gradient field to the polarizing magnetic field, and an RF coil array including a plurality of RF coil elements. Each of these RF coil elements is configured to apply an RF field to the subject and to acquire magnetic resonance image data therefrom. The MRI system further includes a computer system that is programmed to select a plurality of slice locations to be substantially simultaneously manipulated with the RF coil array, to provide an RF transmission, $B_1^+$, map for each of the plurality of RF coil elements in the RF coil array. The computer system is also programmed to identify a subset of slice locations to be manipulated by each of the RF coil elements using the provided RF transmission maps, to design an RF pulse for each of the plurality of RF coil elements using the identified subset of slice locations, and to provide each designed RF pulse to corresponding ones of the plurality of RF coil elements. Additionally, the computer system is programmed to control operation of the plurality of gradient coils and the RF coil array to substantially simultaneously manipulate spins in the selected plurality of slice locations using the provided RF pulses and to acquire MR image data from the subject.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Methods for reducing power deposition during a magnetic resonance imaging ("MRI") scan, in which spins in multiple slice locations are substantially simultaneously manipulated, are provided. In general, an array of radio frequency ("RF") coils, such as a multichannel parallel transmit coil array, is used to produce an RF electromagnetic field that substantially simultaneously manipulates the spins present at different slice locations. The term "manipulating" spins refers generally to rotating the bulk magnetization formed from those spins through an arbitrary angle about an axis and may include variable angle excitation, refocusing, or inversion. By spatially distributing the production of RF fields used for spin manipulation for different physical slice locations to different RF coil elements, power deposited in the subject during the substantially simultaneous manipulation of the slice locations may be reduced. This reduced power deposition may be measured as a reduction in specific absorption rate ("SAR").

The methods of the present invention also allow a reduction in the peak and overall power required to generate a particular $B_1^+$ amplitude in a given location in a volume-of-interest, thereby providing a reduction in the power deposition to each coil element and associated circuitry, as well as the subject by way of reducing the power delivered to the RF system. This reduction in power holds additional benefits. Notably, by reducing the peak power applied to the RF system, the generation of RF fields that would otherwise require a peak power unattainable with current RF system hardware can be realized. For example, if an RF system has a peak voltage limitation of one kilovolt ("kV"), but a 4 kV voltage is desired, then a multichannel transmit coil array may be utilized in accordance with the methods described herein, to distribute that voltage using several different amplifiers each coupled to one or a few of the elements of a multichannel transmit coil, such that the existing peak power associated with the 1 kV peak voltage limitation is satisfied.

Figure 1:
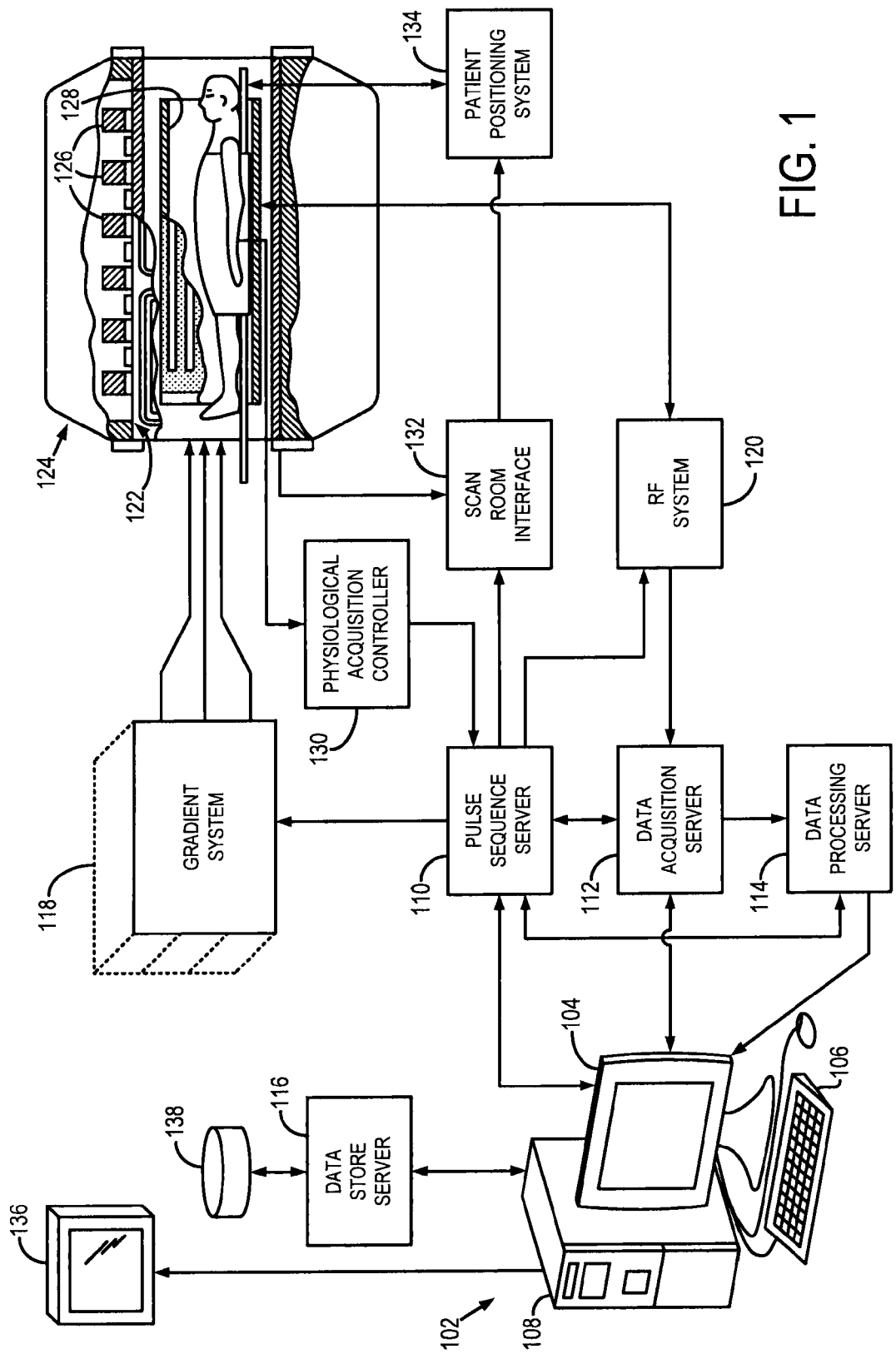
FIG. 1 is a block diagram of an example of a magnetic resonance imaging ("MRI") system.

Referring particularly now to FIG. 1, an example of a magnetic resonance imaging ("MRI") system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF preamplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \tag{1}$$

and the phase of the received MR signal may also be determined:

$$\varphi = \tan^{-1}\left(\frac{Q}{I}\right). \tag{2}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. By way of example, the data acquisition server 112 acquires MR data and processes it in real-time to produce information that may be used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
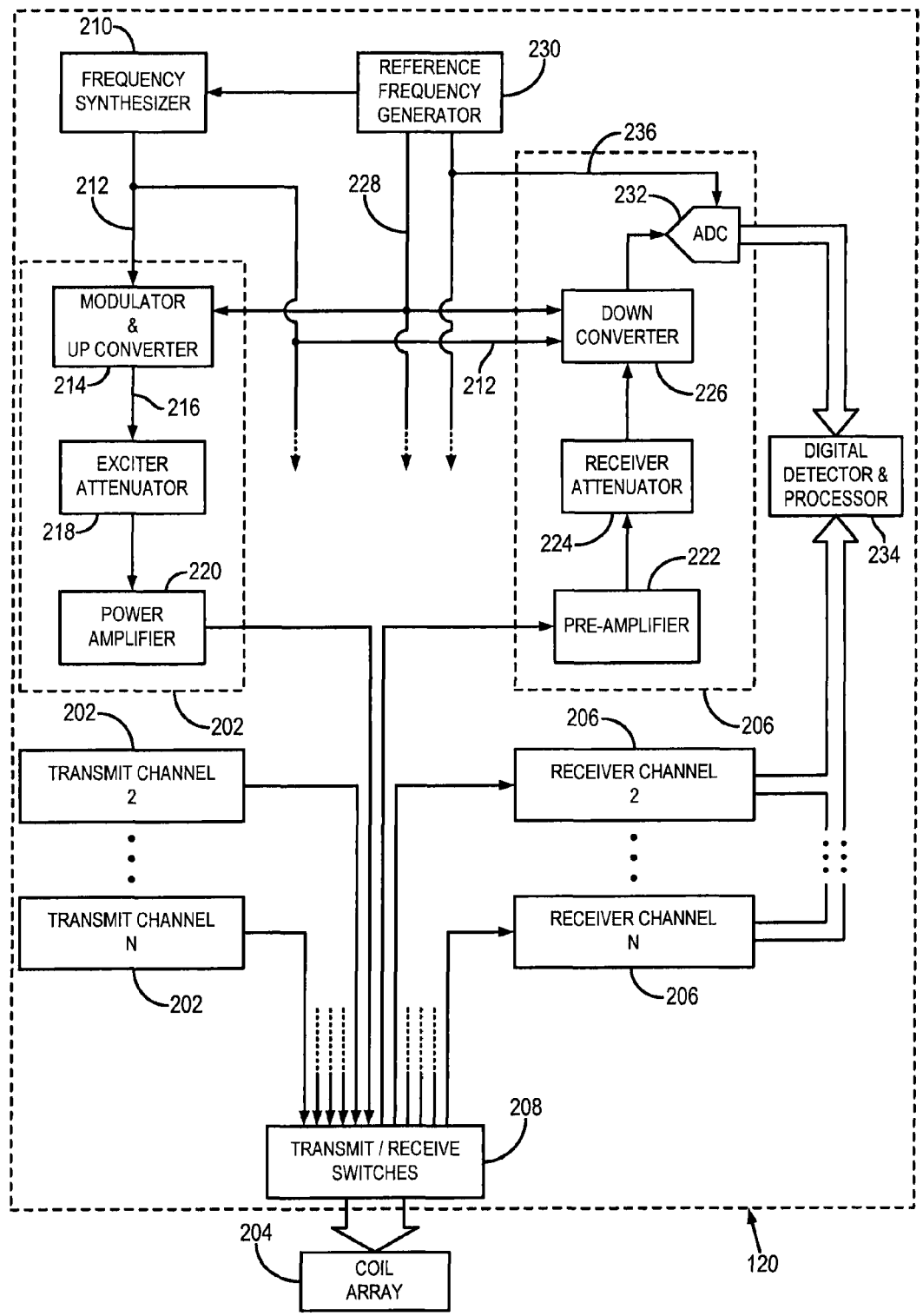
FIG. 2 is a block diagram of an example of a radio frequency ("RF") system that may form part of the MRI system of FIG. 1.

As shown in FIG. 1, the radiofrequency ("RF") system 120 may be connected to the whole body RF coil 128, or, as shown in FIG. 2, a transmission section of the RF system 120 may connect to one or more transmit channels 202 of an RF coil array 204 and a receiver section of the RF system 120 may connect to one or more receiver channels 206 of the RF coil array 204. The transmit channels 202 and the receiver channels 206 are connected to the RF coil array 204 by way of one or more transmit/receive ("T/R") switches 208. The receiver channel 206 may also be an assembly of coils separate from the transmit coil array. In such a configuration, the T/R switches 208 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 2, the RF system 120 includes one or more transmit channels 202 that produce a prescribed RF electromagnetic field. The base, or carrier, frequency of this RF field is produced under control of a frequency synthesizer 210 that receives a set of digital signals from the pulse sequence server 110. These digital signals indicate the frequency, amplitude, and phase of the RF carrier signal produced at an output 212. The RF carrier is applied to a modulator and, if necessary, an up converter 214 where its amplitude and phase is modulated in response to a signal, R(t), also received from the pulse sequence server 110. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 216 is attenuated by an attenuator circuit 218 that receives a digital command from the pulse sequence server 110. The phase of the RF pulse may also be altered using phase shifters (not shown). The modulated RF pulses are then applied to a power amplifier 220 that drives one element of the RF coil array 204, or several such elements that are electrically coupled. Multiple transmit channels then drive other elements of the multichannel transmit coil array.

The MR signal produced by the subject is picked up by the RF coil array 202 and applied to the inputs of the set of receiver channels 206. A preamplifier 222 in each receiver channel 206 amplifies the signal, which is then attenuated, if necessary, by a receiver attenuator 224 by an amount determined by a digital attenuation signal received from the pulse sequence server 110. The received signal is at or around the Larmor frequency, and this high frequency signal may be down converted in a two step process by a down converter 226. In an example of such a process, the down converter 226 first mixes the MR signal with the carrier signal on line 212 and then mixes the resulting difference signal with a reference signal on line 228 that is produced by a reference frequency generator 230. The MR signal is applied to the input of an analog-to-digital ("A/D") converter 232 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal may then be applied to a digital detector and signal processor 234 that produces in-phase (I) and quadrature (Q) values corresponding to the received signal. The resulting stream of digitized I and Q values of the received signal are output to the data acquisition server 112. In addition to generating the reference signal on line 228, the reference frequency generator 230 also generates a sampling signal on line 236 that is applied to the A/D converter 232.

Power deposition, which may be measured by specific absorption rate ("SAR") induced in a subject undergoing an MRI scan in which multiple slice locations are substantially simultaneously manipulated, may be reduced by using multiple RF coils for the transmission of the RF electromagnetic fields. In an ideal configuration, the multiple RF coils will be arranged such that the transmit $B_1$ spatial profile ($B_1^+$) for a given coil, or a set of coils together, is spatially correlated with one of the slice locations in the multi-slice spin manipulation. In such a configuration, a different coil, or different set of coils, generates the desired $B_1^+$ field over the different slice locations. With this technique, the different slice locations can, therefore, be substantially simultaneously manipulated using a multichannel transmission, in which different slice-selective pulses are applied to the different slice locations using the RF coils with the correspondingly appropriate $B_1^+$ profiles. Using this aforementioned technique, and when the profiles of different coil elements in the coil array do not overlap, the power deposited in the subject will not exceed the power that would be deposited by the manipulation of spins in a single slice location with a volume RF coil that covers the equivalent volume as the multiple transmit coils and that generates an equal $B_1$ field over all of the slice locations.

In general, the aforementioned ideal situation does not hold. For example, the $B_1^+$ profile from one RF coil will, generally, partially overlap with the $B_1^+$ profile from another RF coil. As a result of this overlap, the corresponding electric fields will add in a complex way that may either increase or decrease SAR. Additionally, for some slice locations, a single RF coil corresponding to a particular slice location may not exist. Instead, it may be necessary to identify a combination of RF coils, or a combination of sets of RF coils, that can generate an optimum $B_1^+$ field corresponding to a particular slice location. However, as long as some distinct spatial $B_1^+$ profiles exist for the transmit RF coils along the direction of the slices, SAR reduction will occur compared to multiband pulses substantially simultaneously applied with a single transmission coil that covers the entire volume of interest.

In general, a multiband RF pulse is a composite RF pulse composed of multiple RF pulses that share a common temporal footprint. Each of these component RF pulses has a frequency matched to the Larmor frequency, as modified by an applied slice-selection magnetic field gradient, associated with a particular slice location. Thus, each multiband RF pulse includes a number of component pulses, one for each slice location in which spins are to be manipulated by the multiband RF pulse. In a typical multiband RF application, the relative amplitudes of the component RF pulses for each individual slice is equal since only a single RF coil is being used to transmit the multiband RF pulse. As will be described below, however, this is not the case with the present invention.

Figure 3A:
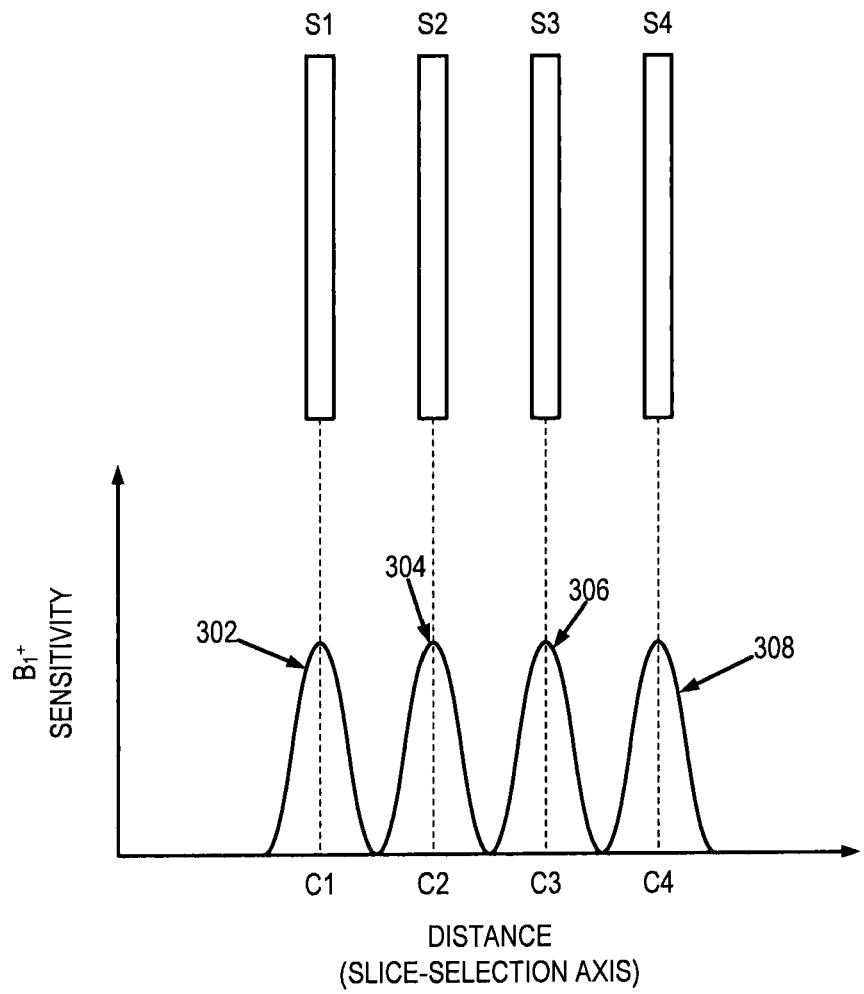
FIG. 3A is a pictorial illustration of an example of a relationship between RF transmission profiles along a slice-selection direction for a plurality of RF coil elements and a plurality of slice locations to be substantially simultaneously manipulated by those RF coil elements, and in which there is substantially no overlap between the RF transmission profiles.
Figure 3B:
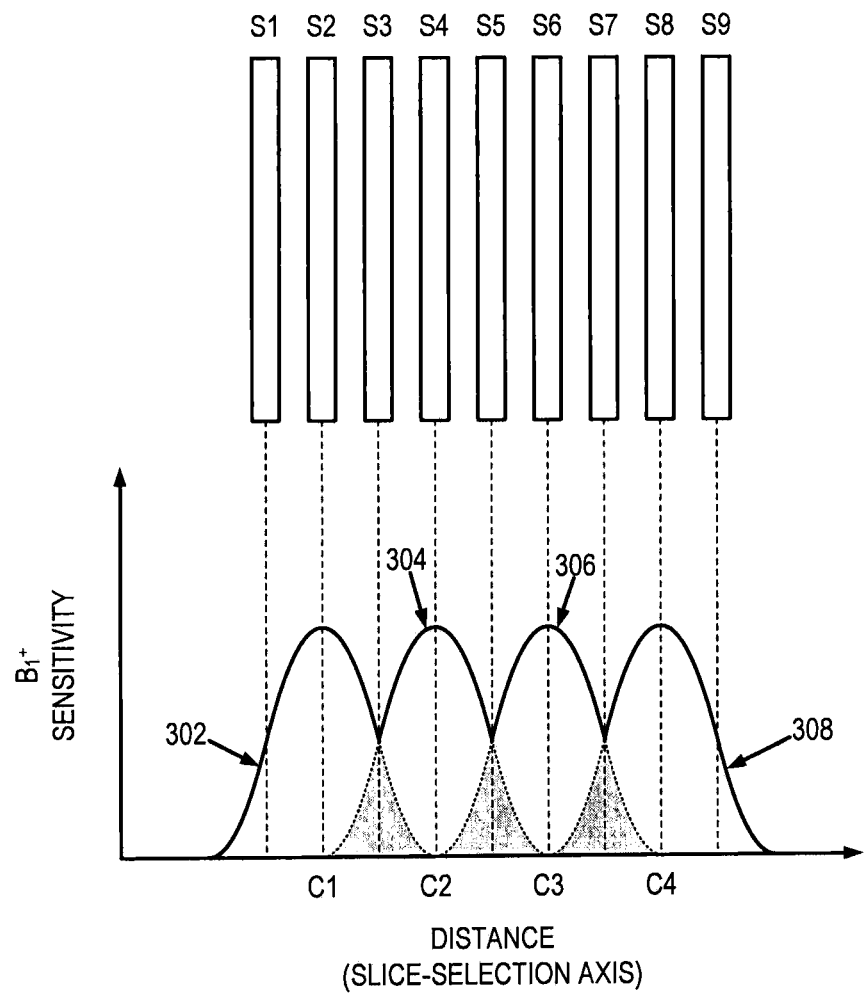
FIG. 3B is a pictorial illustration of an example of a relationship between RF transmission profiles along a slice-selection direction for a plurality of RF coil elements and a plurality of slice locations to be substantially simultaneously manipulated by those RF coil elements, and in which there is an overlap between the RF transmission profiles.

By way of example, and referring now to FIGS. 3A and 3B, four slice locations S1-S4 are substantially simultaneously manipulated using an RF coil array having at least four coil elements C1, C2, C3, and C4 distributed along the slice-selection axis. The $B_1^+$ maps of these coil elements along the slice-selection axis are illustrated at 302, 304, 306, and 308, respectively. In this illustrative example, only the magnitude of the $B_1^+$ field is illustrated, and it is assumed for simplicity that the $B_1^+$ field vectors from all of the coils have the same direction everywhere. As illustrated in FIG. 3A, when there is little or no overlap of the $B_1^+$ profiles 302, 304, 306, 308 with respect to the selected slice locations S1-S4, it will be possible to assign a particular coil element uniquely to a particular slice location. For example, coil element C1 can be uniquely assigned to slice location S1. In this manner, it may be possible to substantially simultaneously manipulate spins in the slice locations S1-S4 by substantially simultaneously transmitting a single-band RF pulse with each respective coil element.

Referring now particularly to FIG. 3B, nine slice locations S1-S9 are substantially simultaneously manipulated using an RF coil array having at least four coil elements C1, C2, C3, and C4 distributed along a slice-selection axis. When there is some overlap between the $B_1^+$ profiles 302, 304, 306, 308 of adjacent coil elements with respect to the desired slice locations, it will not always be possible to uniquely assign a particular coil element for the manipulation of spins in a particular slice location alone during a substantially simultaneous excitation. Rather, the electromagnetic field produced by a particular coil element will influence multiple slice locations, and for some slice locations, the optimum RF pulse may use two adjacent coil elements. In this instance, a subset of slice locations can be selected for spin manipulation by a single coil element by way of transmitting an appropriately designed multiband RF pulse with that coil element. For example, in FIG. 3B, slices S1, S2, S4, S6, S8, and S9 can be manipulated using single coil elements alone. In particular, slices S1 and S2 can be manipulated by coil C1 alone, slice S4 can be manipulated by coil C2 alone, slice S6 can be manipulated by coil C3 alone, and slices S8 and S9 can be manipulated by coil C4 alone. In contrast, slice S3 is affected by both coil element C1 and C2, slice S5 is affected by both coil element C2 and C3, and slice S7 is affected by both coil element C3 and C4. Thus, in this example, the spins in slice S3 can be optimally manipulated by a linear combination of coils C1 and C2, the spins in slice S5 can be optimally manipulated by a linear combination of coils C2 and C3, and the spins in slice S7 can be optimally manipulated by a linear combination of coils C3 and C4.

Thus, a multiband RF pulse that aims to manipulate slices S2, S4, and S6, for example, would be broken down to its three single-band component RF pulses with slice-selective properties centered on slices S2, S4, and S6, respectively. In such a pulse, each single-band component RF pulse may be directed to a single coil element, for example, the single-band component RF pulse with slice-selective properties for slice S2 would go to coil C1 only, the single-band component RF pulse with slice-selective properties for slice S4 would go to coil C2 only, and the single-band component RF pulse with slice-selective properties for slice S6 would go to coil C3 only. In this situation, each of these coils will see a single slice-selective RF pulse, contrary to current uses in practice where the entire coil array, and consequently the entire sample seen by the entire coil array, experiences the sum of all these three pulses. Thus, in current uses, three times the voltage is needed and delivered into the entire imaging volume, as compared to being able to produce each of the single slice-selective RF pulses in separate coils as noted above.

For a multiband pulse that aims to substantially simultaneously manipulate slices S3, S5, and S7, the situation is different. Here, the multiband RF pulse will again be broken down into its three single-band component RF pulses, each with properties for selecting slices S3, 55, and S7, respectively. Considering slice S3, it will be advantageous to apply the slice-selective RF pulse to coils C2 and C3 (possibly with a phase difference depending on the coil geometry), with each coil getting reduced power compared to the power applied to the single appropriate coil for manipulation of slice S2, S4, or S6. Thus, for an RF pulse with its slice-selective properties centered on slice S3, power is applied to coils C1 and C2 such that the vector sum of the $B_1^+$ from the two individual coils adds up to the appropriate magnitude required for the desired rotation of the bulk magnetization. Similarly, for slice S5 power will go to coils C2 and C3, and for slice S7, power will go to coils C3 and C4.

In general, the relative amplitudes and phases of the component RF pulses used to form multiband RF pulses for the substantially simultaneous manipulation of multiple slice locations will be weighted according to the $B_1^+$ generated for the coil element transmitting the component RF pulse at the slice location affected by the component RF pulse. This $B_1^+$ is measured, or calibrated, as an amplitude and phase at each location in space inside the volume-of-interest for each coil element in the transmit coil array. Typically, this calibration is performed at the beginning of an imaging session for a particular subject, and this calibration is used to decide how to generate the single-band or multiband RF pulses for each slice location. For example, it is desirable to achieve the same flip angle for the spins in each slice location. It is known that the flip angle produced by an RF pulse is proportional to the amplitude of the $B_1^+$ field at the locations of the affected spins. However, the amplitude of the $B_1^+$ field will depend on the vector sum of the $B_1^+$ fields generated by each coil element at that location. That is, the vector sum of the $B_1^+$ fields will depend on the amplitude and the phase of the $B_1^+$ field. The phase of the $B_1^+$ field is determined from the $B_1^+$ maps.

Figure 4:
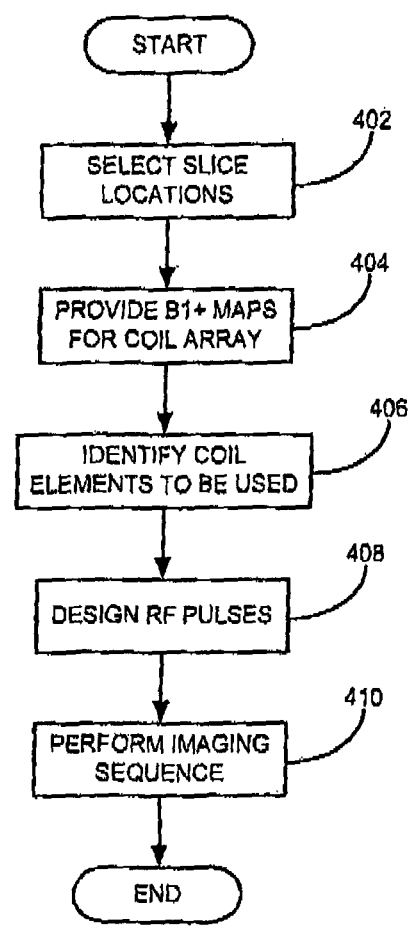
FIG. 4 is a flowchart setting forth an example of a method for reducing power deposition produced by an MRI system when performing a pulse sequence that includes substantially simultaneously manipulating spins in a plurality of slice locations.

Referring now to FIG. 4, a flowchart setting forth the steps of an example of a method for reducing power deposition produced by an MRI system when performing a pulse sequence that includes substantially simultaneously manipulating spins in a plurality of slice locations is illustrated. Particularly, the MRI system includes an RF coil array configured for the transmission of an RF electromagnetic field from multiple RF coil elements in parallel. First, a plurality of slice locations identifying the slices to be imaged in a subject are selected, as indicated at step 402. By way of example, the slice locations may be contiguous, or may be spaced apart by some distance. Next, a $B_1^+$ map is provided for each coil element in the RF coil array, as indicated at step 404. These $B_1^+$ maps may be produced using a $B_1^+$ mapping technique, or may be stored maps from a previous mapping procedure. It is contemplated that producing the $B_1^+$ maps for the particular imaging session will provide better results. The $B_1^+$ maps contain information about the magnitude and direction of the $B_1^+$ field as a function of spatial coordinates over the imaging volume. Because the $B_1^+$ field is a vector quantity in the plane perpendicular to the direction of the main magnetic field, $B_0$, it may be characterized by an amplitude and a phase; thus, the $B_1^+$ maps provide an amplitude and direction of the $B_1^+$ field generated by each coil. These $B_1^+$ maps are used to determine the appropriate combination of RF coil elements to be used for the manipulation of spins in each slice location. Thus, the next step is to identify those RF coil elements to be used to manipulate spins in each of the prescribed slice locations using the provided $B_1^+$ maps, as indicated at step 406. For example, the amount of overlap between the $B_1^+$ maps is identified and used to determine whether each slice location can be uniquely manipulated by a single RF coil element, or whether multiple RF coil elements will influence the same slice location.

After the individual RF coil elements of the transmit coil array that will affect each of the slice locations has been determined, the RF pulses to be transmitted for the substantially simultaneous manipulation of spin in the slice locations are designed, as indicated at step 408. By way of example, if a given RF coil element is identified as being used to manipulate the spins in only one slice location, then the RF pulse transmitted by that RF coil element may be designed as a single-band RF pulse specifically tailored to the corresponding slice location. On the other hand, if a given RF coil element is identified as being used to manipulate the spins in more than one slice location, then the appropriate multiband RF pulse may be designed. For example, if the subset of slice locations includes three slice locations, then a multiband RF pulse composed of three component RF pulses, one tailored for each slice location, may be designed. The relative amplitudes of the component RF pulses that form the multiband RF pulse may be determined using information about the spatial sensitivity of the RF coil element over the respective slice location, which information is contained in the provided $B_1^+$ maps. Once the appropriate RF pulses have been designed, they are communicated to the MRI system and used to perform an imaging sequence during which the plurality of slice locations are substantially simultaneously manipulated by substantially simultaneously transmitting the designed RF pulses with the corresponding RF coil elements.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for substantially simultaneously exciting spins in a plurality of slice locations using a magnetic resonance imaging (MRI) system that includes a radio frequency (RF) coil array composed of a plurality of RF coil elements, the steps of the method comprising:
    a) selecting a plurality of slice locations to be substantially simultaneously manipulated with the MRI system;
    b) providing an RF transmission ($B_1^+$) map for each of the plurality of RF coil elements in the RF coil array;
    c) identifying those of the plurality of RF coil elements to be used to manipulate respective ones of the plurality of slice locations selected in step a) using the RF transmission maps provided in step b);
    d) designing an RF pulse to be transmitted by each of the RF coil elements identified in step c); and
    e) substantially simultaneously transmitting the RF pulses designed in step d) to manipulate spins in each of the plurality of slice locations.

2. The method as recited in claim 1 in which step c) includes identifying overlaps between the RF transmission maps provided in step b).

3. The method as recited in claim 2 in which an RF coil element identified in step c) as having an RF transmission map that does not overlap the RF transmission map for an adjacent RF coil element is assigned to manipulate one slice location.

4. The method as recited in claim 3 in which step d) includes designing a single-band RF pulse for each RF coil element assigned to one slice location.

5. The method as recited in claim 2 in which an RF coil element identified in step c) as having an RF transmission map that overlaps the RF transmission map for an adjacent RF coil element is assigned to at least two slice locations.

6. The method as recited in claim 5 in which step d) includes designing a multiband RF pulse for each RF coil element assigned to at least two slice locations.

7. The method as recited in claim 6 in which the multiband RF pulse is composed of a number of component RF pulses equal to a number of slice locations to be manipulated by the multiband RF pulse.

8. The method as recited in claim 1, wherein step d) includes designing a combination of at least one single-band RF pulse and at least one multiband RF pulse, such that step e) includes substantially simultaneously transmitting the combination of the at least one single-band RF pulse and the at least one multiband RF pulse to manipulate spins in each of the plurality of slice locations.

9. A magnetic resonance imaging (MRI) system, comprising:
    a magnet system configured to generate a polarizing magnetic field about at least a portion of a subject arranged in the MRI system;
    a plurality of gradient coils configured to apply a gradient field to the polarizing magnetic field;
    a radio frequency (RF) coil array including a plurality of RF coil elements, each RF coil element configured to apply an RF field to the subject and to acquire magnetic resonance (MR) image data therefrom;
    a computer system programmed to:
        select a plurality of slice locations to be substantially simultaneously manipulated with the RF coil array;
        provide an RF transmission ($B_1^+$) map for each of the plurality of RF coil elements in the RF coil array;
        identify those of the plurality of RF coil elements to be used to manipulate respective ones of the plurality of slice locations using the provided RF transmission maps;
        design an RF pulse for the identified ones of the plurality of RF coil elements;
        provide each designed RF pulse to corresponding ones of the plurality of RF coil elements; and
        control operation of the plurality of gradient coils and the RF coil array to substantially simultaneously manipulate spins in the selected plurality of slice locations using the provided RF pulses and to acquire MR image data from the subject.

10. The MRI system as recited in claim 9 in which the computer system is further programmed to identify those of the plurality of RF coil elements to be used to manipulate respective ones of the plurality of slice locations by identifying overlaps between the provided RF transmission maps.

11. The MRI system as recited in claim 10 in which the computer system is further programmed to assign an RF coil element identified as having an RF transmission map that does not overlap the RF transmission map for an adjacent RF coil element to one slice location.

12. The MRI system as recited in claim 11 in which the computer system is further programmed to design the RF pulse for each RF coil element assigned to one slice location as a single-band RF pulse.

13. The MRI system as recited in claim 10 in which the computer system is further programmed to assign an RF coil element identified as having an RF transmission map that overlaps the RF transmission map for an adjacent RF coil element to at least two slice locations.

14. The MRI system as recited in claim 13 in which the computer system is further programmed to designed the RF pulse for each RF coil element assigned to at least two slice locations as a multiband RF pulse.

15. The MRI system as recited in claim 14 in which computer system is programmed to design the multiband RF pulse to include a number of component RF pulses equal to a number of slice locations to be manipulated by the multiband RF pulse.

16. The MRI system as recited in claim 9, wherein the computer system is programmed to design an RF pulse for the identified ones of the plurality of RF coil elements by designing a combination of at least one single-band RF pulse and at least one multiband RF pulse such that the designed RF pulses provided to corresponding ones of the plurality of RF coil elements by the computer system comprise the combination of the at least one single-band RF pulse and the at least one multiband RF pulse.

* * * * *